US010366907B2

(12) United States Patent
Jang et al.

(10) Patent No.: US 10,366,907 B2
(45) Date of Patent: Jul. 30, 2019

(54) MANUFACTURING METHOD OF SEMICONDUCTOR PACKAGE

(71) Applicant: DISCO CORPORATION, Tokyo (JP)

(72) Inventors: Byeongdeck Jang, Tokyo (JP); Youngsuk Kim, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 16/020,037

(22) Filed: Jun. 27, 2018

(65) Prior Publication Data
US 2019/0006198 A1 Jan. 3, 2019

(30) Foreign Application Priority Data

Jun. 29, 2017 (JP) ................. 2017-126891

(51) Int. Cl.
| H01L 21/56 | (2006.01) |
|---|---|
| H01L 21/683 | (2006.01) |
| H01L 21/3105 | (2006.01) |
| H01L 21/78 | (2006.01) |
| H01L 23/00 | (2006.01) |
| H01L 23/31 | (2006.01) |

(52) U.S. Cl.
CPC ...... *H01L 21/561* (2013.01); *H01L 21/31058* (2013.01); *H01L 21/56* (2013.01); *H01L 21/565* (2013.01); *H01L 21/568* (2013.01); *H01L 21/6836* (2013.01); *H01L 21/78* (2013.01); *H01L 23/3128* (2013.01); *H01L 24/97* (2013.01); *H01L 24/48* (2013.01); *H01L 2221/68327* (2013.01); *H01L 2224/48091* (2013.01); *H01L 2224/48106* (2013.01); *H01L 2224/48227* (2013.01)

(58) Field of Classification Search
CPC ......... H01L 24/48; H01L 24/97; H01L 23/00; H01L 23/31; H01L 23/312; H01L 23/3128; H01L 21/31; H01L 21/31; H01L 21/3105; H01L 21/31058; H01L 21/56; H01L 21/561; H01L 21/565; H01L 21/568; H01L 21/68; H01L 21/683; H01L 21/6836; H01L 21/78
USPC ....................................................... 438/113
See application file for complete search history.

(56) References Cited

U.S. PATENT DOCUMENTS

| 8,420,414 B2 * | 4/2013 | Horiuchi | H01L 33/486 257/E21.499 |
|---|---|---|---|
| 2001/0036711 A1 * | 11/2001 | Urushima | H01L 21/563 438/460 |
| 2002/0105069 A1 * | 8/2002 | Kawahara | H01L 21/4832 257/690 |

FOREIGN PATENT DOCUMENTS

JP        2001023936 A        1/2001

* cited by examiner

*Primary Examiner* — Monica D Harrison
(74) *Attorney, Agent, or Firm* — Greer Burns & Crain, Ltd.

(57) ABSTRACT

There is provided a manufacturing method of a semiconductor package in which plural semiconductor chips different in the thickness are mounted. In the manufacturing method, the back surface of a package board in which the plural semiconductor chips on a wiring base are collectively sealed by a sealant is held by a holding tape and a resin layer is thinned by a shaping abrasive stone. Then, a dividing unit is caused to cut to the middle of the holding tape along planned dividing lines to divide the package board into individual semiconductor packages.

2 Claims, 5 Drawing Sheets

MANUFACTURING METHOD OF SEMICONDUCTOR PACKAGE

BACKGROUND OF THE INVENTION

Field of the Invention

The present invention relates to a manufacturing method of a semiconductor package in which chips different in the thickness are sealed by a sealant.

Description of the Related Art

Conventionally, package techniques in which plural chips are sealed into one package like the system in package (SIP) and so forth have been developed. In such package techniques, a wiring board is segmented by planned dividing lines and plural chips are mounted in each of the regions marked out by the planned dividing lines. Furthermore, the plural chips are collectively sealed by a mold resin and thereby a package board is fabricated. Then, the package board is cut along the planned dividing lines to be divided into individual semiconductor packages in which the plural chips are subjected to packaging (for example, refer to Japanese Patent Laid-open No. 2001-023936). Furthermore, in recent years, as a package board, a board in which chips are mounted on a redistribution layer like the Fan-out Wafer Level Package and so forth has also been known.

SUMMARY OF THE INVENTION

However, if plural chips different in the thickness are mounted on a wiring base such as a wiring board or a redistribution layer in a horizontally-placed state, when the plural chips are collectively sealed by a mold resin, variation is caused in the thickness of the mold resin from chip to chip. For this reason, there is a problem that the heat dissipation effect is different among the chips in one package.

Thus, an object of the present invention is to provide a manufacturing method of a semiconductor package that can equalize the heat dissipation effect of plural chips different in the thickness.

In accordance with an aspect of the present invention, there is provided a manufacturing method of a semiconductor package in which a plurality of chips different in the thickness are connected onto a wiring base turned to an individual piece and are sealed by a sealant. The manufacturing method includes a holding step of holding, by a holding tape or a holding jig, a side of the wiring base of a package board in which the plurality of chips are disposed in a region marked out by intersecting planned dividing lines formed on the wiring base and are collectively sealed by the sealant, a step forming step of forming a step in an upper surface of the sealant by a shaping abrasive stone in which a step to thin the sealant to a predetermined thickness corresponding to each chip to cause heat dissipation performance to become the same is formed, and a dividing step of cutting to the middle of the holding tape or into the holding jig by a dividing unit along the planned dividing lines to divide the package board into individual semiconductor packages.

According to this configuration, the upper surface of the sealant of the package board is ground by the shaping abrasive stone with the step and the thicknesses from the respective chip upper surfaces to the upper surface of the sealant are aligned. Thus, by dividing the package board into individual semiconductor packages, the heat dissipation effect of the plural chips different in the thickness in one package can be equalized.

Furthermore, because the thickness of the sealant of each of the plural chips can be aligned by the shaping abrasive stone, the package board can be easily fabricated through collective sealing of the plural chips on the wiring base by the sealant. The state in which the thicknesses from the respective chip upper surfaces to the upper surface of the sealant are aligned is not limited to the case in which the thicknesses of the resin completely correspond with each other. A certain degree of variation may be caused in the thickness of the resin from the respective chip upper surfaces to the upper surface of the sealant as long as the heat dissipation performance gets close to the same.

Furthermore, in the above-described manufacturing method of a semiconductor package, the shaping abrasive stone and the dividing unit may be each a processing tool including a base that has a mounting hole mounted to a rotating spindle at a central part and has a circular ring shape and a plurality of circular ring protrusions that protrude in parallel radially outward across the whole of an outer circumferential surface of the base. Moreover, a step to thin the sealant to a predetermined thickness corresponding to each chip when the plurality of circular ring protrusions are caused to cut to the middle of the holding tape or into the holding jig may be formed between the circular ring protrusions. In addition, the step forming step and the dividing step may be simultaneously carried out by using the processing tool and carrying out cutting processing to the middle of the holding tape or into the holding jig in such a manner that the positions of the circular ring protrusions are adjusted to the planned dividing lines.

According to the present invention, the heat dissipation effect of the plural chips different in the thickness can be equalized by aligning the thicknesses from the respective chip upper surfaces to the upper surface of the sealant by the step of the shaping abrasive stone.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
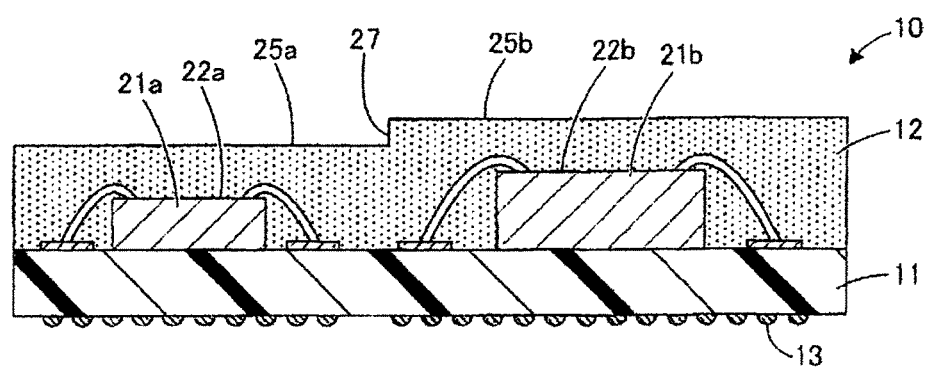
FIG. 1 is a sectional schematic diagram of a semiconductor package according to an embodiment of the present invention.
Figure 2:
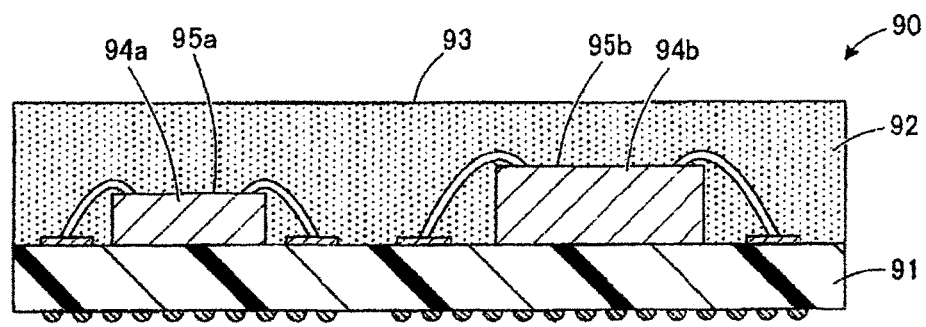
FIG. 2 is a sectional schematic diagram of a semiconductor package of a comparative example.

A manufacturing method of a semiconductor package according to an embodiment of the present invention will be described below with reference to the accompanying drawings. FIG. 1 is a sectional schematic diagram of the semiconductor package of the present embodiment. FIG. 2 is an explanatory diagram of a semiconductor package of a comparative example. The following embodiment merely depicts one example, and another step may be included between the respective steps and the order of steps may be changed as appropriate.

As depicted in FIG. 1, a semiconductor package 10 is semiconductor apparatus of the SIP or the like in which plural semiconductor chips (chips) 21a and 21b are subjected to packaging, and the semiconductor chips 21a and 21b are protected from the external environment by a resin layer (sealant) 12. In the semiconductor package 10, the semiconductor chips 21a and 21b mounted on the upper surface of the wiring board (wiring base) 11 are sealed by the resin layer 12 and bumps 13 are disposed on the lower surface of the wiring board 11. On the wiring board 11, various kinds of wiring lines including electrodes and ground lines connected to the semiconductor chips 21a and 21b are formed.

The semiconductor chips 21a and 21b are formed by turning a semiconductor wafer to individual pieces on each device basis. Furthermore, the semiconductor chips 21a and 21b are formed with different thicknesses and are mounted in a predetermined region of the wiring board 11 in a horizontally-placed state. The plural semiconductor chips 21a and 21b are included in the package and the semiconductor chips 21a and 21b are connected to each other. Thereby, the plural semiconductor chips 21a and 21b are integrated in the single package. In such a semiconductor package 10, besides protection of the semiconductor chips 21a and 21b from the external environment such as shock and foreign objects, heat dissipation performance to transfer heat generated in the semiconductor chips 21a and 21b to the external is required.

Incidentally, normally, as depicted in the comparative example of FIG. 2, semiconductor chips 94a and 94b on a wiring board 91 are collectively sealed by a resin layer 92 and a package upper surface 93 of a semiconductor package 90 is formed flat. For this reason, a difference is generated in the thickness of the resin layer 92 from chip upper surfaces 95a and 95b of the respective semiconductor chips 94a and 94b to the package upper surface 93. The resin layer 92 is thickly stacked on the semiconductor chip 94a with a thin shape and the resin layer 92 is thinly stacked on the semiconductor chip 94b with a thick shape. Thus, the heat dissipation performance of the semiconductor chip 94a with the thin shape is lowered relative to the semiconductor chip 94b with the thick shape and variation is caused in the heat dissipation performance between the semiconductor chips 94a and 94b in the semiconductor package 90.

Accordingly, as depicted in FIG. 1, a step 27 is formed between package upper surfaces 25a and 25b of the semiconductor package 10 in the present embodiment, and the thicknesses from chip upper surfaces 22a and 22b of the semiconductor chips 21a and 21b different in the thickness to the package upper surfaces 25a and 25b are set identical. This makes it possible to equalize the heat dissipation effect of the respective semiconductor chips 21a and 21b in the package irrespective of the thicknesses of the semiconductor chips 21a and 21b. At this time, by grinding the resin layer 12 by a shaping abrasive stone 41 with a step 45 (see FIG. 4A), the thickness of the resin layer 12 of the semiconductor package 10 can be partly adjusted according to the thicknesses of the respective semiconductor chips 21a and 21b.

Figure 3A:
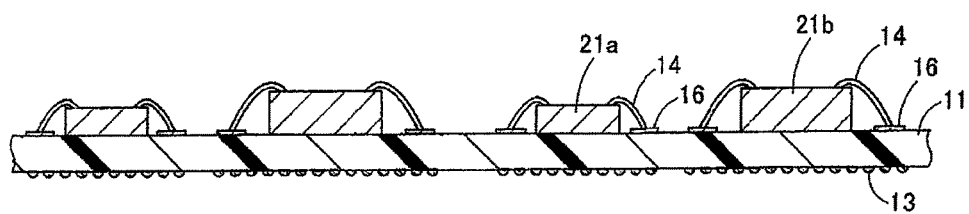
FIG. 3A, FIG. 3B, and FIG. 3C are explanatory diagrams of a manufacturing method of the semiconductor package of the embodiment.
Figure 3B:
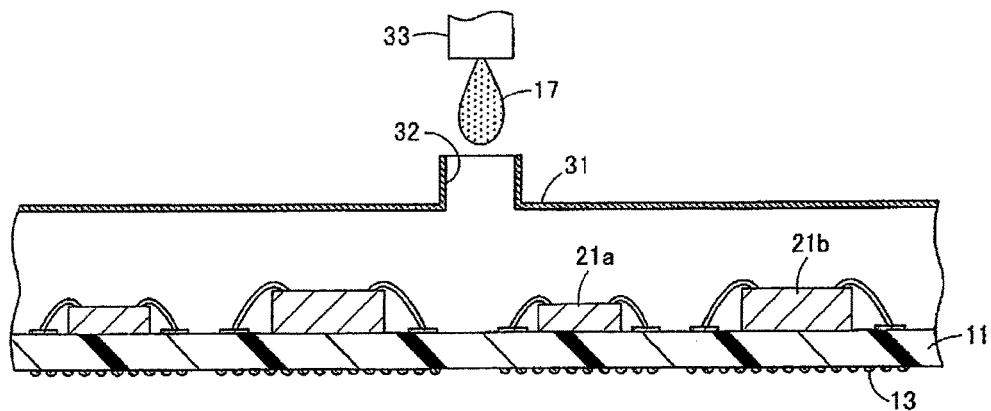
Figure 3C:
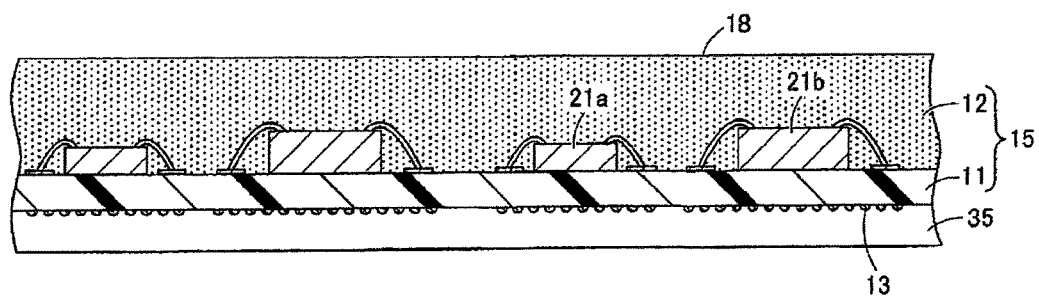
Figure 4A:
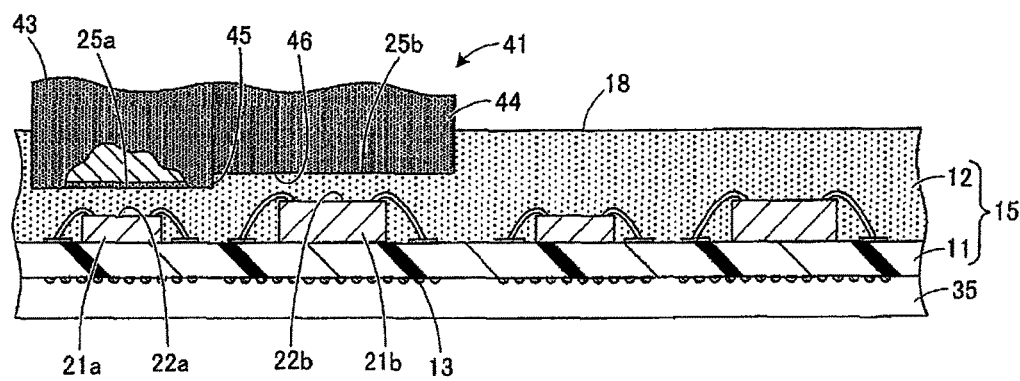
FIG. 4A, FIG. 4B, and FIG. 4C are explanatory diagrams of the manufacturing method of the semiconductor package of the embodiment.
Figure 4B:
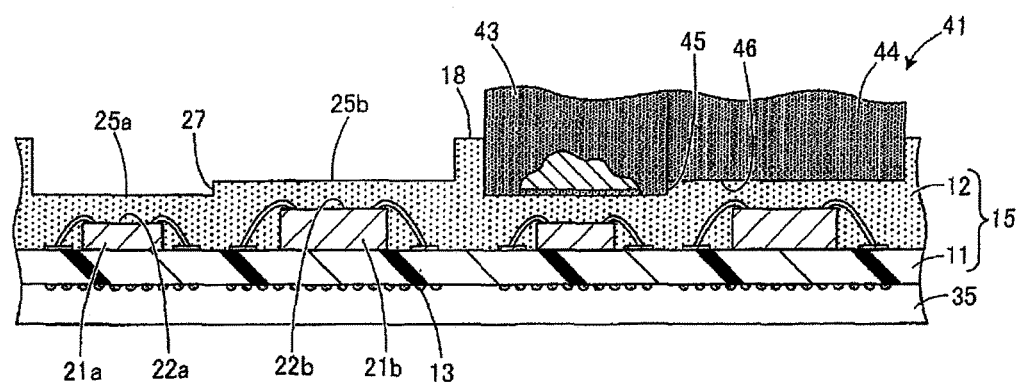
Figure 4C:
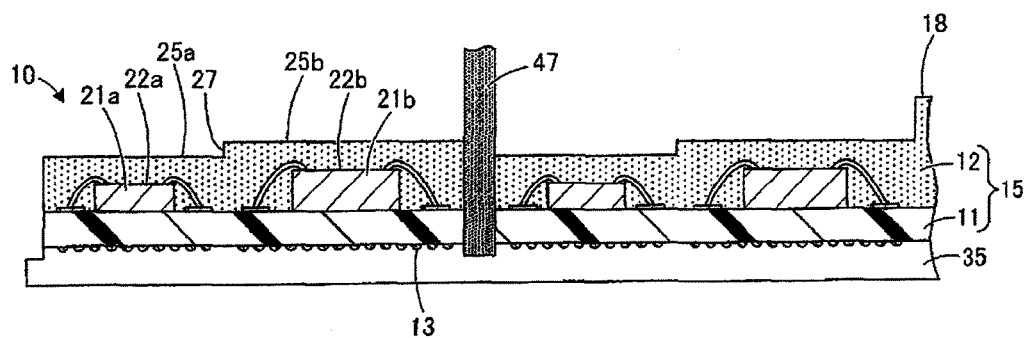

The manufacturing method of the semiconductor package of the present embodiment will be described below with reference to FIG. 3 and FIG. 4. FIG. 3 and FIG. 4 are explanatory diagrams of the manufacturing method of the semiconductor package of the present embodiment. FIG. 3A, FIG. 3B, and FIG. 3C are diagrams depicting one example of a mounting step, a board fabrication step, and a holding step, respectively. Furthermore, FIG. 4A and FIG. 4B are diagrams depicting one example of a step forming step and FIG. 4C is a diagram depicting one example of a dividing step.

As depicted in FIG. 3A, first the mounting step is carried out. In the mounting step, a surface of the wiring board 11 is segmented into a lattice manner by intersecting planned dividing lines and the plural semiconductor chips 21a and 21b are mounted in each of the respective regions that are marked out. In this case, two kinds of semiconductor chips 21a and 21b different in the thickness are disposed in a horizontally-placed state in each region on the wiring board 11, and the semiconductor chips 21a and 21b are arranged to make a line one direction (toward the deep side of the paper plane) on each kind basis on the wiring board 11. The semiconductor chips 21a and 21b different in the thickness may have the same function or have different functions.

Wiring lines such as ground lines are formed in the wiring board 11 and the bumps 13 are disposed on the lower surface of the wiring board 11. One end of each of wires 14 is connected to a respective one of electrodes on the upper surfaces of the semiconductor chips 21a and 21b and the other end of each of the wires 14 is connected to a respective one of electrodes 16 on the surface of the wiring board 11. The semiconductor chips 21a and 21b are connected to each other through wiring lines of the wiring board 11 and thereby a system having plural functions is constructed. In the mounting step, the bonding method is not limited to the wire bonding and flip-chip bonding by which electrodes on the lower surfaces of the semiconductor chips 21a and 21b are connected directly to the electrodes on the surface of the wiring board 11 may be carried out.

As depicted in FIG. 3B, the board fabrication step is carried out after the mounting step is carried out. In the board fabrication step, a sealant 17 is supplied to the surface side of the wiring board 11 on which the plural semiconductor chips 21a and 21b are mounted and the respective semiconductor chips 21a and 21b are collectively sealed by the sealant 17, so that a package board 15 (see FIG. 3C) is fabricated. In this case, the lower surface of the wiring board 11 is held by a holding jig (not depicted) and a mold 31 is disposed to cover the upper surface of the wiring board 11. An injection port 32 is opened in the upper wall of the mold 31 and a supply nozzle 33 of the sealant 17 is located above the injection port 32.

Then, the sealant 17 is supplied to the upper surface of the wiring board 11 from the supply nozzle 33 through the injection port 32 and the semiconductor chips 21a and 21b are sealed. In this state, the sealant 17 is heated or dried to be cured and the package board 15 in which the resin layer 12 (see FIG. 3C) is formed on the upper surface of the wiring board 11 is fabricated. As the sealant 17, what has curability is used. For example, the material can be selected from epoxy resin, silicone resin, urethane resin, unsaturated polyester resin, acrylic urethane resin, polyimide resin, and so forth. Furthermore, the sealant 17 is not limited to a liquid form and it is also possible to use a resin in a sheet form or a powder form. In this manner, the plural semiconductor chips 21a and 21b on the wiring board 11 are collectively sealed. If the package board 15 is prepared in advance, the mounting step and the board fabrication step may be omitted.

As depicted in FIG. 3C, the holding step is carried out after the board fabrication step is carried out. In the holding step, a holding tape 35 is stuck to close the center of a ring frame (not depicted) and the side of the wiring board 11 of the package board 15 is held by this holding tape 35. In this case, the bumps 13 of the package board 15 enter an adhesive layer of the holding tape 35 and the package board 15 is favorably supported by the ring frame with the intermediary of the holding tape 35. In the holding step, a ring frame having a circular shape in top view may be used and a ring frame having a rectangular shape in top view may be used.

As depicted in FIG. 4A, the step forming step is carried out after the holding step is carried out. In the step forming step, the formed shaping abrasive stone 41 corresponding to the step shape of the package upper surfaces 25a and 25b of the semiconductor package 10 (see FIG. 4C) is mounted to the tip of a rotating spindle. The shaping abrasive stone 41 is formed into a circular cylindrical shape composed of a larger-diameter part 43 and a smaller-diameter part 44 and a step 45 is formed at the boundary between the larger-diameter part 43 and the smaller-diameter part 44. The larger-diameter part 43 protrudes relative to the smaller-diameter part 44 by the difference between the thicknesses of the semiconductor chips 21a and 21b. On the outer circumferential surface of the shaping abrasive stone 41, an abrasive grain layer 46 is formed through electrodeposition of abrasive grains of diamond or the like.

When the side of the wiring board 11 of the package board 15 is held by a chuck table (not depicted) with the intermediary of the holding tape 35, the position of the step 45 of the shaping abrasive stone 41 is adjusted between the semiconductor chips 21a and 21b and the shaping abrasive stone 41 is lowered to a depth at the middle in the thickness direction of the resin layer 12 outside the package board 15. Then, processing feed of the package board 15 is carried out relative to the shaping abrasive stone 41 in the arrangement direction of the semiconductor chips 21a and 21b (toward the deep side of the paper plane) and the resin layer 12 between the chip upper surfaces 22a and 22b of the semiconductor chips 21a and 21b and a board upper surface 18 of the package board 15 is thinned. Due to this, the resin layer 12 of the package board 15 is cut by the shaping abrasive stone 41 over the chuck table and the package board 15 is thinned.

The resin layer 12 over the semiconductor chip 21a with the thin shape is deeply cut away by the larger-diameter part 43 of the shaping abrasive stone 41 and the resin layer 12 over the semiconductor chip 21b with the thick shape is shallowly cut away by the smaller-diameter part 44 of the shaping abrasive stone 41. Because the larger-diameter part 43 of the shaping abrasive stone 41 protrudes relative to the smaller-diameter part 44 by the difference between the thicknesses of the semiconductor chips 21a and 21b, the thicknesses from the chip upper surfaces 22a and 22b of the respective semiconductor chips 21a and 21b to the resin layer upper surfaces (package upper surfaces) 25a and 25b after the grinding are aligned. As above, by cutting the resin layer 12 by the formed shaping abrasive stone 41, the resin layer 12 is thinned to predetermined thicknesses corresponding to the respective semiconductor chips 21a and 21b by the step 45 of the shaping abrasive stone 41, so that the step 27 is formed.

As depicted in FIG. 4B, after the resin layer 12 over the semiconductor chips 21a and 21b arranged on one line is ground, the position of the step 45 of the shaping abrasive stone 41 is adjusted between the semiconductor chips 21a and 21b on a line adjacent across a planned dividing line and the resin layer 12 is ground. By the repetition of this operation, the steps 27 on plural lines are formed in the board upper surface 18 of the package board 15 and the resin layer 12 over all semiconductor chips 21a and 21b in the package board 15 is aligned to the same thickness. The amount of cutting into the resin layer 12 by the shaping abrasive stone 41 is adjusted to a depth with which the semiconductor chips 21a and 21b can obtain a sufficient heat dissipation effect through the resin layer 12.

As depicted in FIG. 4C, the dividing step is carried out after the step forming step. In the dividing step, the package board 15 is divided into the individual semiconductor packages 10 along the planned dividing lines. A cutting blade (dividing unit) 47 formed into a circular plate shape through binding of diamond abrasive grains or the like by a binding agent is mounted to a rotating spindle (not depicted) and the side of the wiring board 11 of the package board 15 is held by a chuck table (not depicted) with the intermediary of the holding tape 35. The position of the cutting blade 47 is adjusted to the planned dividing line of the package board 15 and the cutting blade 47 is lowered to a depth at which the cutting blade 47 can cut to the middle of the holding tape 35 outside the package board 15.

Then, cutting feed of the package board 15 is carried out relative to the cutting blade 47 in the horizontal direction along the planned dividing line. After the package board 15 is fully cut along one planned dividing line, the position of the cutting blade 47 is adjusted to an adjacent planned dividing line and the package board 15 is fully cut. By the repetition of this cutting operation, the package board 15 is divided into the individual semiconductor packages 10 along the planned dividing lines. In this manner, the semiconductor packages 10 in which the semiconductor chips 21a and 21b different in the thickness are connected over the wiring board 11 and are sealed by the resin layer 12 is manufactured.

As above, according to the manufacturing method of the semiconductor package 10 of the present embodiment, the board upper surface 18 of the package board 15 is ground by the shaping abrasive stone 41 with the step 45 and the thicknesses of the resin layer 12 from the respective chip upper surfaces 22a and 22b are aligned. Thus, by dividing the package board 15 into the individual semiconductor chips 10, the heat dissipation effect of the plural semiconductor chips 21a and 21b different in the thickness in one package can be equalized. Furthermore, because the thickness of the resin layer 12 of each of the semiconductor chips 21a and 21b can be aligned by the shaping abrasive stone 41, the package board 15 can be easily fabricated through collective sealing of the plural semiconductor chips 21a and 21b on the wiring board 11 by the resin layer 12.

In the present embodiment, the configuration in which the dividing step is carried out after the step forming step is employed. However, the present invention is not limited to this configuration. It suffices for the step forming step and the dividing step to be carried out after the holding step. For example, the step forming step may be carried out after the dividing step. Furthermore, the step forming step and the dividing step may be simultaneously carried out in a processing step using a dedicated processing tool. Here, one example of the processing step in which the step forming step and the dividing step are simultaneously carried out will be described with reference to FIG. 5.

Figure 5:
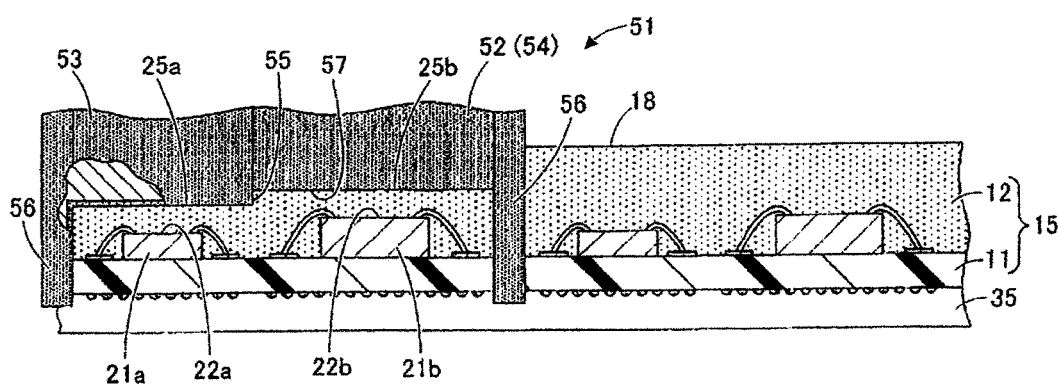
FIG. 5 is a diagram depicting one example of a processing step of another embodiment.

As depicted in FIG. 5, in the processing step, a base 52 having a circular ring shape in a processing tool 51 is mounted to the tip of a rotating spindle. The base 52 of the processing tool 51 has a mounting hole mounted to the rotating spindle at a central part and a pair of circular ring protrusions 56 protrude in parallel radially outward across the whole of the outer circumferential surface of the base 52. The part between the pair of circular ring protrusions 56 is formed into a circular cylindrical shape composed of a larger-diameter part 53 and a smaller-diameter part 54 and a step 55 is formed at the boundary between the larger-diameter part 53 and the smaller-diameter part 54. The larger-diameter part 53 protrudes relative to the smaller-diameter part 54 by the difference between the thicknesses of the semiconductor chips 21*a* and 21*b*. An abrasive grain layer 57 is formed on the outer circumferential surface of the processing tool 51 through electrodeposition of abrasive grains of diamond or the like.

When the side of the wiring board 11 of the package board 15 is held by a chuck table (not depicted) with the intermediary of the holding tape 35, the positions of the pair of circular ring protrusions 56 of the processing tool 51 are adjusted to planned dividing lines and the step 55 of the processing tool 51 is positioned between the semiconductor chips 21*a* and 21*b*. Furthermore, outside the package board 15, the processing tool 51 is lowered to a depth at which cutting to the middle of the holding tape 35 by the circular ring protrusions 56 is possible and cutting into the board upper surface 18 by the larger-diameter part 53 and the smaller-diameter part 54 is possible. Then, processing feed of the package board 15 is carried out relative to the processing tool 51 in the horizontal direction and the package board 15 is processed along the planned dividing lines.

The package board 15 is divided by the pair of circular ring protrusions 56 and the resin layer 12 of the package board 15 is ground by the larger-diameter part 53 and the smaller-diameter part 54 between the pair of circular ring protrusions 56. The resin layer 12 over the semiconductor chip 21*a* with the thin shape is deeply cut away by the larger-diameter part 53 of the processing tool 51 and the resin layer 12 over the semiconductor chip 21*b* with the thick shape is shallowly cut away by the smaller-diameter part 54 of the processing tool 51. Thereby, the thicknesses from the chip upper surfaces 22*a* and 22*b* of the respective semiconductor chips 21*a* and 21*b* to the package upper surfaces 25*a* and 25*b* are aligned. By causing the circular ring protrusions 56 to cut to the holding tape 35, the resin layer 12 is thinned to a predetermined thickness corresponding to the respective semiconductor chips 21*a* and 21*b* by the step 55 of the processing tool 51.

Also with such a processing step, the thicknesses from the respective chip upper surfaces 22*a* and 22*b* to the package upper surfaces 25*a* and 25*b* are aligned and the heat dissipation effect of the plural semiconductor chips 21*a* and 21*b* different in the thickness in one package can be equalized. Furthermore, because the step forming step and the dividing step are simultaneously carried out in the processing step, the work man-hour can be reduced. Although the configuration in which the pair of circular ring protrusions 56 protrude from the outer circumference of the base 52 is employed here, the present invention is not limited to this configuration. It suffices that plural circular ring protrusions protrude from the outer circumference of the base, and three or more circular ring protrusions may protrude from the outer circumference of the base for example.

Furthermore, in the present embodiment, the configuration is employed in which the thickness of the resin layer from the chip upper surface of the semiconductor chip to the package upper surface is reduced to enhance the heat dissipation performance. However, the present invention is not limited to this configuration. The resin layer between semiconductor chips adjacent to each other may be thinned to further enhance the heat dissipation performance. In this case, the step forming step, the dividing step, and a groove forming step may be simultaneously carried out in a processing step using a modification example of the processing tool. Here, a modification example of the processing step will be described with reference to FIG. 6.

Figure 6:
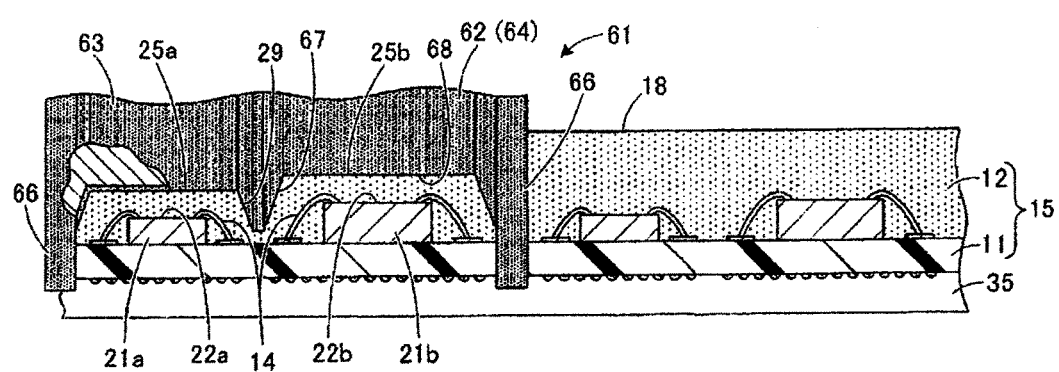
FIG. 6 is a diagram depicting a modification example of a processing step of another embodiment.

As depicted in the modification example of FIG. 6, a pair of circular ring protrusions 66 protrude radially outward from both ends of a base 62 having a circular cylindrical shape in a processing tool 61 and an intermediate protrusion 67 protrudes from the base 62 between the pair of circular ring protrusions 66. The amount of protrusion of the intermediate protrusion 67 is suppressed relative to the circular ring protrusions 66 and the intermediate protrusion 67 is formed into a trapezoidal shape in sectional view in such a manner that the protrusion width becomes smaller in the outward direction. The part between one circular ring protrusion 66 and the intermediate protrusion 67 is a larger-diameter part 63 of a circular cylinder and an inclined surface is formed between the one circular ring protrusion 66 and the larger-diameter part 63.

Furthermore, the part between the other circular ring protrusion 66 and the intermediate protrusion 67 is a smaller-diameter part 64 of a circular cylinder and an inclined surface is formed between the other circular ring protrusion 66 and the smaller-diameter part 64. The larger-diameter part 63 protrudes relative to the smaller-diameter part 64 by the difference between the thicknesses of the semiconductor chips 21*a* and 21*b*. An abrasive grain layer 68 is formed on the outer circumferential surface of the processing tool 61 through electrodeposition of abrasive grains of diamond or the like.

When the side of the wiring board 11 of the package board 15 is held by a chuck table (not depicted) with the intermediary of the holding tape 35, the positions of the pair of circular ring protrusions 66 of the processing tool 61 are adjusted to planned dividing lines and the intermediate protrusion 67 of the processing tool 61 is positioned between the semiconductor chips 21*a* and 21*b*. Furthermore, outside the package board 15, the processing tool 61 is lowered to a depth at which cutting to the middle of the holding tape 35 by the circular ring protrusions 66 is possible and cutting into the board upper surface 18 by the larger-diameter part 63 and the smaller-diameter part 64 is possible. Then, processing feed of the package board 15 is carried out relative to the processing tool 61 in the horizontal direction and the package board 15 is processed along the planned dividing lines.

The package board 15 is divided by the pair of circular ring protrusions 66 and the resin layer 12 of the package board 15 is ground by the larger-diameter part 63 and the smaller-diameter part 64 between the pair of circular ring protrusions 66. The resin layer 12 over the semiconductor chip 21*a* with the thin shape is deeply cut away by the larger-diameter part 63 of the processing tool 61 and the resin layer 12 over the semiconductor chip 21*b* with the thick shape is shallowly cut away by the smaller-diameter part 64 of the processing tool 61. Thereby, the thicknesses from the chip upper surfaces 22*a* and 22*b* of the respective semiconductor chips 21*a* and 21*b* to the package upper surfaces 25*a* and 25*b* are aligned. Moreover, the intermediate protrusion 67 is caused to cut into the resin layer 12 between the semiconductor chips 21*a* and 21*b* and a groove 29 is formed in the resin layer 12 between the semiconductor chips 21*a* and 21*b*.

Also with the processing step of such a modification example, the thicknesses from the respective chip upper surfaces 22*a* and 22*b* to the package upper surfaces 25*a* and 25*b* are aligned and the heat dissipation effect of the plural semiconductor chips 21*a* and 21*b* different in the thickness in one package can be equalized. Furthermore, because the step forming step and the dividing step are simultaneously carried out in the processing step, the work man-hour can be reduced. Moreover, the side surfaces of the intermediate protrusion 67 and side surfaces of the circular ring protrusions 66 avoid wires 14 based on the inclination. Thus, cutting of the wires 14 by the intermediate protrusion 67 and the circular ring protrusions 66 is prevented. Although the step forming step, the dividing step, and the groove forming step are simultaneously carried out here, these steps may be individually carried out or any two steps may be simultaneously carried out.

Figure 7A:
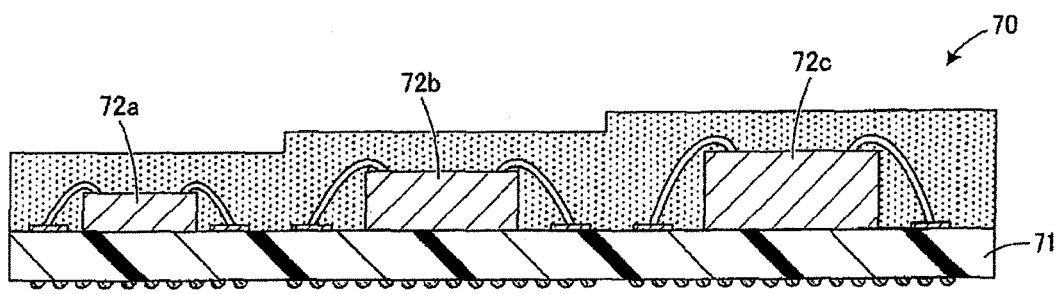
FIG. 7A and FIG. 7B are diagrams depicting modification examples of the semiconductor package.
Figure 7B:
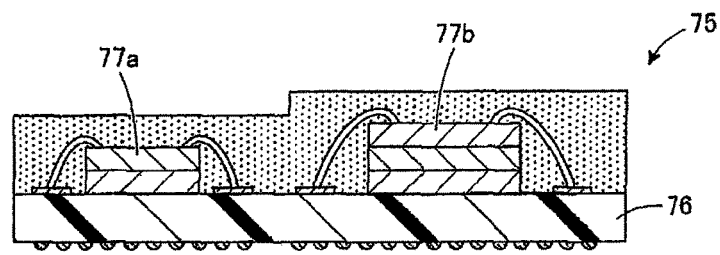

Furthermore, although the semiconductor package in which two semiconductor chips are mounted on a wiring board is exemplified in the present embodiment, the present invention is not limited to this configuration. It suffices that plural semiconductor chips be mounted on a wiring board. For example, as depicted in a modification example of FIG. 7A, three semiconductor chips 72*a* to 72*c* may be mounted on a wiring board 71 in a semiconductor package 70. In addition, as depicted in a modification example of FIG. 7B, stacking chips 77*a* and 77*b* each obtained by stacking plural chips may be mounted on a wiring board 76 in a semiconductor package 75.

Figure 8:
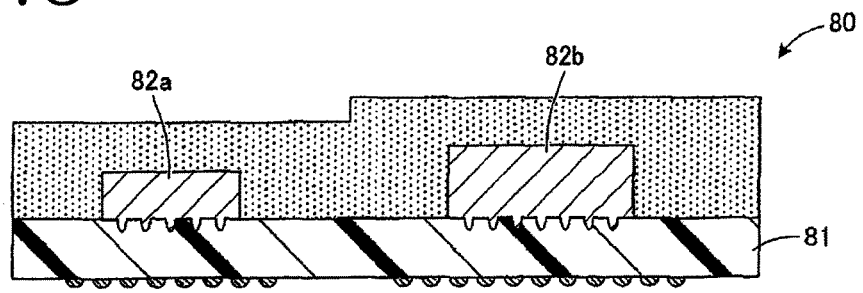
FIG. 8 is a diagram depicting another modification example of the semiconductor package.

Moreover, although the configuration in which the semiconductor package in which semiconductor chips are connected to electrodes on a wiring board through wires based on wire bonding is manufactured is described in the present embodiment, the present invention is not limited to this configuration. As depicted in a modification example of FIG. 8, semiconductor chips 82*a* and 82*b* may be directly connected to electrodes on a wiring board 81 based on flip-chip bonding in a semiconductor package 80.

Furthermore, although the dividing step is carried out by using a cutting blade as a dividing means (dividing unit) in the present embodiment, the present invention is not limited to this configuration. It suffices for the dividing step to have a configuration to divide a package board into individual semiconductor packages. For example, a processing head for laser ablation may be used as the dividing means (dividing unit) and a package board may be divided by ablation processing. The laser ablation refers to the following phenomenon. When the irradiation intensity of a laser beam becomes equal to or higher than a predetermined processing threshold, the energy of the laser beam is converted to electronic, thermal, photochemical, and mechanical energy at a solid surface. As a result, neutral atoms, molecules, positive and negative ions, radicals, clusters, electrons, and light are explosively discharged and the solid surface is etched.

Moreover, although the configuration in which the back surface of a board is held by the holding tape and the respective steps are carried out is employed in the present embodiment, the present invention is not limited to this configuration. For example, the respective steps may be carried out in the state in which the back surface of a board is held by a holding jig. Furthermore, it suffices for the holding jig to be capable of holding a board and the holding jig may be formed of a chuck table or a substrate for example.

In addition, although the configuration in which semiconductor chips are mounted on a wiring base as chips is employed in the above-described embodiments, the present invention is not limited to this configuration. It suffices for the chips to be chip components mounted on a wiring base and the chips may be formed of capacitors or other chip components for example.

Furthermore, although the configuration in which plural chips different in the thickness are mounted on a wiring board is employed in the above-described embodiments, the present invention is not limited to this configuration. The package board may be the so-called Fan-out Wafer Level Package and a configuration in which plural chips different in the thickness are mounted on a redistribution layer may be employed. Therefore, the wiring base is not limited to a wiring board such as a printed circuit board (PCB) and may be a redistribution layer of the fan-out wafer level package.

Moreover, although the configuration in which a step is formed in a shaping abrasive stone in such a manner that the thicknesses from the chip upper surfaces of the respective chips to the resin layer upper surfaces (package upper surfaces) after grinding become the same is employed in the above-described embodiments, the present invention is not limited to this configuration. It suffices that the step be formed in the shaping abrasive stone in such a manner that the heat dissipation performance of the respective chips becomes the same. Therefore, the present invention is not limited to the configuration in which the thicknesses from the chip upper surfaces of the respective chips to the resin layer upper surfaces (package upper surfaces) after grinding become completely the same, and a certain degree of variation may be caused in the thickness as long as the heat dissipation performance gets close to the same.

In addition, the semiconductor package is not limited to the configuration used for portable communication equipment such as a mobile phone and may be used for other kinds of electronic equipment such as a camera.

Furthermore, although the present embodiments and modification examples are described, what are obtained by combining the above-described respective embodiments and modification examples totally or partly may be employed as other embodiments of the present invention.

Moreover, the embodiments of the present invention are not limited to the above-described respective embodiments and modification examples and may be variously changed, replaced, and modified without departing from the gist of technical ideas of the present invention. Furthermore, if a technical idea of the present invention can be implemented in another way based on the progress of a technique or another technique that is derivative, the technical idea may be carried out by using the method. Therefore, the scope of claims covers all embodiments that can be included in the range of the technical ideas of the present invention.

In addition, although the configuration in which the present invention is applied to a manufacturing method of a semiconductor package is described in the present embodiments, it is also possible to apply the present invention to a manufacturing method of another package component in which plural chips are subjected to packaging.

As described above, the present invention has an effect that the heat dissipation effect of plural chips different in the thickness can be equalized and is useful particularly for a manufacturing method of a semiconductor package used for portable communication equipment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of a semiconductor package in which a plurality of chips different in thickness are connected onto a wiring base turned to an individual piece and are sealed by a sealant, the manufacturing method comprising:

a holding step of holding, by a holding tape or a holding jig, a side of the wiring base of a package board in which the plurality of chips are disposed in a region marked out by intersecting planned dividing lines formed on the wiring base and are collectively sealed by the sealant;

a step forming step of forming a step in an upper surface of the sealant by a shaping abrasive stone in which a step to thin the sealant to a predetermined thickness corresponding to each chip to cause heat dissipation performance to become the same is formed; and a dividing step of cutting to middle of the holding tape or into the holding jig by a dividing unit along the planned dividing lines to divide the package board into individual semiconductor packages.

2. The manufacturing method of a semiconductor package according to claim 1, wherein the shaping abrasive stone and the dividing unit are each a processing tool including a base that has a mounting hole mounted to a rotating spindle at a central part and has a circular ring shape and a plurality of circular ring protrusions that protrude in parallel radially outward across whole of an outer circumferential surface of the base, a step to thin the sealant to a predetermined thickness corresponding to each chip when the plurality of circular ring protrusions are caused to cut to the middle of the holding tape or into the holding jig is formed between the circular ring protrusions, and the step forming step and the dividing step are simultaneously carried out by using the processing tool and carrying out cutting processing to the middle of the holding tape or into the holding jig in such a manner that positions of the circular ring protrusions are adjusted to the planned dividing lines.

* * * * *